United States Patent
Smiciklas et al.

(10) Patent No.: US 10,401,439 B2
(45) Date of Patent: Sep. 3, 2019

(54) SYSTEM AND METHOD FOR A CAVITY MAGNETOMETER USING A POUND-DREVER-HALL DETECTOR

(71) Applicant: Honeywell International Inc., Morris Plains, NJ (US)

(72) Inventors: Marc Smiciklas, Phoenix, AZ (US); Robert Compton, Loretto, MN (US); Mary K. Salit, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 205 days.

(21) Appl. No.: 15/453,061

(22) Filed: Mar. 8, 2017

(65) Prior Publication Data

US 2018/0246175 A1 Aug. 30, 2018

Related U.S. Application Data

(60) Provisional application No. 62/464,107, filed on Feb. 27, 2017.

(51) Int. Cl.
*G01R 33/032* (2006.01)
*G01R 33/035* (2006.01)

(52) U.S. Cl.
CPC ......... *G01R 33/032* (2013.01); *G01R 33/035* (2013.01)

(58) Field of Classification Search
CPC ............................ G01R 33/032; G01R 33/035
See application file for complete search history.

(56) References Cited

U.S. PATENT DOCUMENTS 7,826,065 B1 * 11/2010 Okandan ............... G01B 11/02
  324/244.1
2007/0002328 A1 * 1/2007 Woods ................. G01R 31/308
  356/489

(Continued)

FOREIGN PATENT DOCUMENTS

JP 2013150926 A 8/2013
WO 2006114635 A2 11/2006
WO WO 2006114635 A2 * 11/2006 ........... G01R 33/032

OTHER PUBLICATIONS

European Patent Office, "Extended European Search Report from EP Application No. 18157971.5 dated Aug. 3, 2018", "from Foreign Counterpart of U.S. Appl. No. 15/453,061", dated Aug. 3, 2018, pp. 1-16, Published in: EP.

(Continued)

*Primary Examiner* — Akm Zakaria
(74) *Attorney, Agent, or Firm* — Fogg & Powers LLC

(57) ABSTRACT

In one embodiment, a method is provided. The method comprises: spin polarizing alkali atoms in a cavity; shifting resonant frequencies of the cavity at a rate proportional to a magnitude of a magnetic field incident upon the cavity; reflecting modulated right hand circularly polarized light and modulated left hand circularly polarized light from the cavity; transforming the reflected modulated right hand circularly polarized light to reflected modulated vertically polarized light, and the reflected modulated left hand circularly polarized light to reflected modulated horizontally polarized modulated light; generating a first error signal having an amplitude proportional to the shift in a resonant frequency corresponding to the reflected modulated vertically polarized light and a sign indicative of whether a frequency of the reflected modulated vertically polarized light is above or below the corresponding resonant frequency; generating a second error signal having an ampli- (Continued)

tude proportional to the shift in a resonant frequency corresponding to the reflected modulated horizontally polarized light and a sign indicative of whether a frequency of the reflected modulated horizontally polarized light is above or below the corresponding resonant frequency; adjusting a carrier frequency of the modulated right hand circularly polarized light in response to the first error signal; adjusting a carrier frequency of the modulated left hand circularly polarized light in response to the second error signal; and generating a measured Larmor frequency.

20 Claims, 4 Drawing Sheets

(56) References Cited

U.S. PATENT DOCUMENTS

| 2013/0265042 | A1 | 10/2013 | Kawabata et al. | |
| 2014/0183530 | A1* | 7/2014 | Yamazaki | H01L 29/7869 257/43 |
| 2015/0358026 | A1* | 12/2015 | Gan | G04F 5/14 331/94.1 |

OTHER PUBLICATIONS

Mitchell, Morgan W., "Generation, characterization and use of atom-resonant indistinguishable photon pairs", ICFO—Institut de Ciencies Fotoniquest, Feb. 26, 2015pp. 1-31, Barcelona, Spain.

Baryshev, et al., "Use of AOM-RN as a Phase Modulator in FM Sideband Heterodyne Technique in the Atomic Frequency Standards", Aug. 8, 2011, pp. 1-4, Publisher: 2011 Joint Conference of the IEEE International Frequency Control and the European Frequency and Time Forum (FCS) Proceedings.

Black, "Laser Interferometer Gravitational Wave Observatory", "LIGO Project", Apr. 16, 1998, pp. 1-15, Publisher: California Institute of Technology and Massachusetts Institute of Technology.

Budker et al., "Optical Magnetometry", Feb. 2, 2008, pp. 1-11.

Crepaz et al., "Cavity enhanced atomic magnetometry", Oct. 4, 2015, pp. 1-6.

Crepaz, et al., "Cavity enhanced atomic magnetometry", Oct. 20, 2015, pp. 1-7, Publisher: Scientific Reports.

Smith et al., "Electric Current Tuning the Self-Oscillation Frequency of EC-VCSELs", "Photonics Technology Letters", Sep. 1, 2013, pp. 1707-1710, vol. 25, No. 17, Publisher: IEEE.

Sycz, et al., "Resonant Faraday effect in a Fabry-Perot cavity", Mar. 30, 2010, pp. 633-639, vol. 40, No. 3, Publisher: Institute of Physics, Jagiellonian University.

Yu, et al., "Optomechanical Magnetometry with a Macroscopic Resonator", "Physical Review Applied", Apr. 15, 2016, pp. 1-6, Publisher: American Physical Society.

Baryshev, Viacheslav, et al., "Use of AOM-RN as a Phase Modulator in FM Sideband Heterodyne Technique in the Atomic Frequency Standards"; pp. 1-6; Retrieved on Mar. 2, 2017.

Honeywell Aerospace; "Magnetic Sensors and Transducers"; Found at https://aerospace.honeywell.com/en/navigation-and-sensors/magnetic-sensors-and-transducers; retrieved on Dec. 18, 2018; pp. 1-4; Published: US.

Prouty, M., et al., "Small, Low Power, High Performance Magnetometers"; EGM 2010 International Workshop; Adding new value to Electromagnetic, Gravity and Magnetic Methods for Exploration; Capri, Italy, Apr. 11-14, 2010; pp. 1-5.

Sheng, D., et al.; "Subfemtotesla Scalar Atomic Magnetometry Using Multipass Cells"; Physical Review Letters; Week ending Apr. 19, 2013; 2013American Physical Soceity; pp. 160802-1 to 160802-5.

Smullin, S.J., et al.; "Low-noise high-density alkali-metal scalar magnetometer"; Physical Review; 2009 The American Physical Society; pp. 033420-1 to 033420-10.

Yu, C.Q., et al., "Optomechanical Magnetometry: Macroscale CaF2 Resonator for Ultrasensitive Magnetic Field Detection"; pp. 1; Retrieved Mar. 8, 2017.

* cited by examiner

SYSTEM AND METHOD FOR A CAVITY MAGNETOMETER USING A POUND-DREVER-HALL DETECTOR

CROSS-REFERENCE TO RELATED APPLICATION

This application claims the benefit of U.S. Provisional Patent Application Ser. No. 62/464,107, filed Feb. 27, 2017, which is incorporated herein by reference in its entirety.

BACKGROUND

Atomic scalar magnetometers, or scalar magnetometers, measure total magnetic field, and are substantially insensitive to orientation and vibration. Scalar magnetometers are widely used in geophysical and object search surveys where the magnetometers may be in motion. Modern magnetometer cells are on the order of one hundred cubic centimeters in volume. A corresponding magnetometer system consumes watts of power because of a required power level of a pump laser to operate the system. The pump laser spin polarizes atoms in the cell to detect the magnitude of incident magnetic fields.

Smaller atomic magnetometer cells, which can include smaller optical cavities, are desirable because not only do they facilitate smaller magnetometer systems, but also because the systems consume significantly less power because the pump laser can operate at much lower power levels. As the volume of an atomic magnetometer cell, and e.g. cavity, diminishes, the optical path length likewise diminishes, thereby reducing the magnitude of the magnetometer signal and thus magnetometer sensitivity. Therefore, there is a need for a small cavity-based atomic magnetometer system whose sensitivity is not so diminished.

SUMMARY

In one embodiment, a method is provided. The method comprises: spin polarizing alkali atoms in a cavity; shifting resonant frequencies of the cavity at a rate proportional to a magnitude of a magnetic field incident upon the cavity; reflecting modulated right hand circularly polarized light and modulated left hand circularly polarized light from the cavity; transforming the reflected modulated right hand circularly polarized light to reflected modulated vertically polarized light, and the reflected modulated left hand circularly polarized light to reflected modulated horizontally polarized light; generating a first error signal having an amplitude proportional to the shift in a resonant frequency corresponding to the reflected modulated vertically polarized light and a sign indicative of whether a frequency of the reflected modulated vertically polarized light is above or below the corresponding resonant frequency; generating a second error signal having an amplitude proportional to the shift in a resonant frequency corresponding to the reflected modulated horizontally polarized light and a sign indicative of whether a frequency of the reflected modulated horizontally polarized light is above or below the corresponding resonant frequency; adjusting a carrier frequency of the modulated right hand circularly polarized light in response to the first error signal; adjusting a carrier frequency of the modulated left hand circularly polarized light in response to the second error signal; and generating a measured Larmor frequency.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding background and summary, or the following detailed description.

Figure 1:
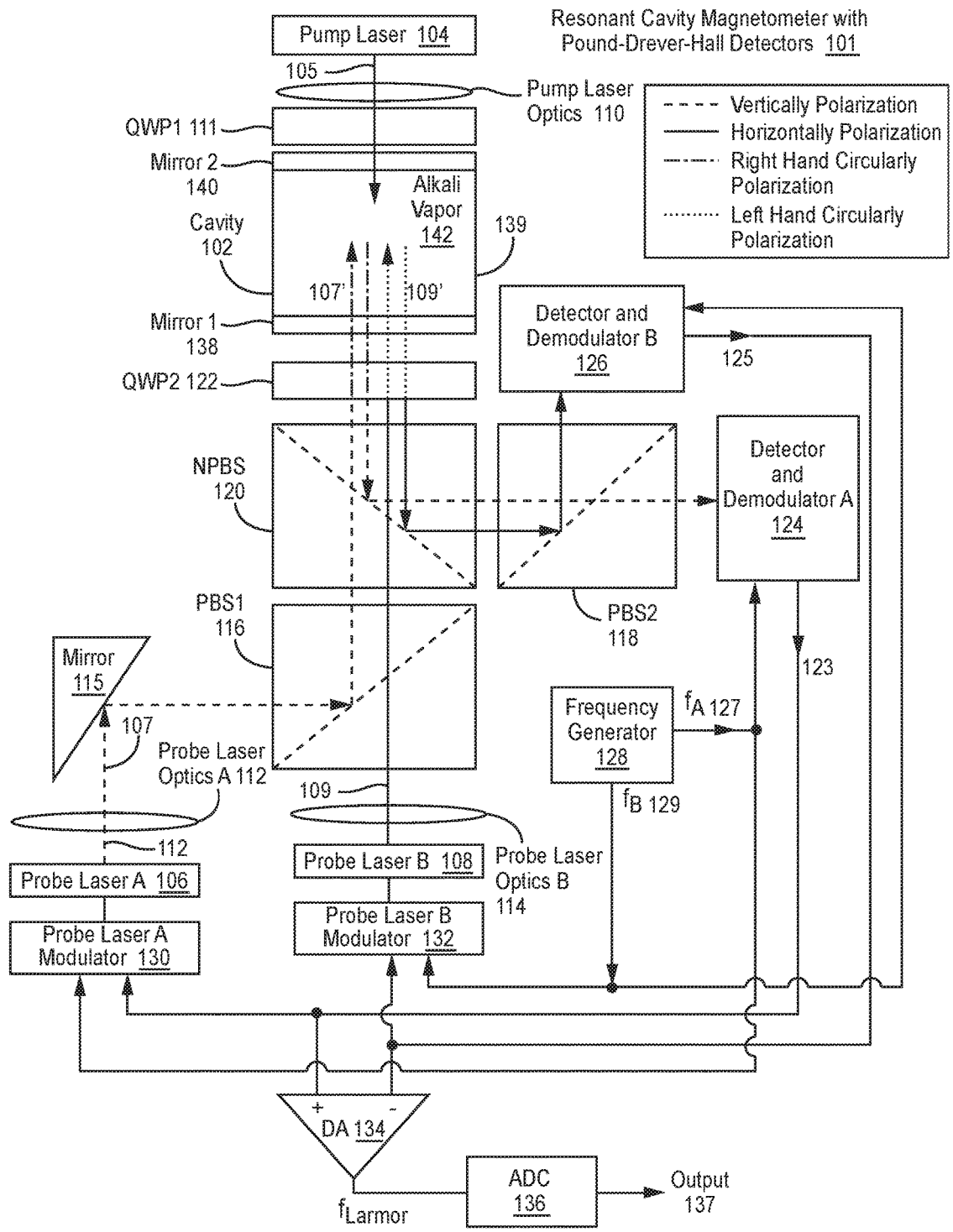
FIG. 1 illustrates one embodiment of a block diagram of a cavity magnetometer using Pound-Drever-Hall detectors (PDH cavity magnetometer)

FIG. 1 illustrates one embodiment of a block diagram of a resonant cavity magnetometer using Pound-Drever-Hall detectors (PDH cavity magnetometer) 101. The PDH cavity magnetometer 101 includes a cavity 102, a pump laser 104, a probe laser A 106, a probe laser B 108, pump laser optics 110, probe laser A optics 112, probe laser B optics 114, a first polarizing beam splitter (PBS1) 116, a second polarizing beam splitter (PBS2) 118, a non-polarizing beam splitter (NPBS) 120, a first quarter-wave plate (QWP1) 111, a second quarter-wave plate (QWP2) 122, a detector and demodulator A 124, a detector and demodulator B 126, a frequency generator 128, a probe laser A modulator 130, a probe laser B modulator 132, a differential amplifier (DA) 134, and an analog to digital converter (ADC) 136.

In one embodiment, the pump laser 104 is not required. Rather, one of the probe lasers may be used as the pump laser. This may be facilitated, for example, by utilizing probe laser A and disabling or disengaging the mirror 115. For example, two additional mirrors can be used to adjust the focal direction of laser light beam of probe laser A so that it is directed, e.g. through the pump laser optics 110 and the second quarter wave plate 111. Further, when used as a pump laser, probe laser A would not be phase or frequency modulated. However, the probe laser A modulator would adjust the carrier frequency of a laser light beam of probe laser A so that it would be shifted in frequency, e.g. to the D1 resonant frequency of the alkali atoms. When spin polarization of the alkali atoms is achieved by the probe laser, it would then be operated as a conventional probe laser as subsequently described.

Although light sources, i.e. the pump laser 104, the probe laser A 106, and the probe laser B 108 are subsequently illustrated as lasers, it is contemplated that other types of light sources may be used in lieu of one or more of the lasers. For example, a light emitting diode could be used in lieu of a pump laser. Further, in one embodiment, the pump laser 104, the probe laser A 106, and/or the probe laser B 108 are vertical-cavity surface-emitting lasers (VCSELs).

In one embodiment, the carrier frequency of the probe laser A 106 and the probe laser B 108 are detuned from one of the atomic resonance frequencies of the alkali atoms to increase the Finesse or Quality factor of the cavity 102. In another embodiment, the pump and probe lasers are tuned to be at or about the different resonant frequencies of the alkali atoms. In a further embodiment, the carrier frequency of the pump laser 104 is tuned to be on the center of the D1 resonant frequency of the alkali atoms. In yet another embodiment, the carrier frequency of the probe lasers are tuned to be offset from the D2 resonant frequency of the alkali atoms.

In one embodiment, the pump laser 104 consumes less than one Watt. In another embodiment, the pump laser consumes less than one milli-Watt. In a further embodiment, each probe laser consumes less than one Watt. In yet another embodiment, each probe laser consumes less than one milli-Watt.

In one embodiment, the cavity 102 is substantially formed from a spacer material 139, e.g. a semiconductor such as silicon, using semiconductor fabrication techniques. In another embodiment, the spacer material 139 is substantially similar to the micro-fabricated cells used for chip scale atomic clocks. In a further embodiment, the cavity 102 includes a first mirror (Mirror 1) 138 and a second mirror (Mirror 2) 140 each of which is located at an open end, e.g. having no sidewall, of the spacer material 139. In yet another embodiment, the first mirror 138 and the second mirror 140 are formed from stacked layers of dielectrics having different indices of refraction. In yet a further embodiment, the number and type of stack layers differ for the first mirror 138 and the second mirror 140.

The cavity 102 has a resonance whose resonant frequency is determined, at least in part, by the distance between the first mirror 138 and the second mirror 140 and the index of refraction of the alkali vapor 142. The reflectivities of the first mirror 138 and the second mirror 140, and/or the dimensions of the cavity 102 are designed so that the cavity 102 has a relatively high Finesse or Quality (Q) factor. In one embodiment, the Finesse ranges from 20 to 40. Because the signal detected by each Pound-Drever-Hall detector is approximately proportional to the Finesse of the cavity 102, the sensitivity of the PDH cavity magnetometer 101 having high Finesse has high sensitivity despite decreased optical path length arising from a reduction in the size of the cavity 102.

In one embodiment, the first mirror 138 has a reflectivity, in the frequency band of the probe laser A 106 and probe laser B 108, of between ninety to ninety-five percent. In another embodiment, the second mirror 140 has a reflectivity of 99.99% in the same frequency band. As stated above, in an embodiment, the pump laser 104 operates in a different resonant frequency of the alkali atoms. The second mirror 140 has substantially lower reflectivity, and thus higher transitivity, in the frequency band of the pump laser 104.

In one embodiment, the cavity 102 is filled with an alkali vapor 142. In another embodiment, the alkali vapor 142 is formed from an alkali element, such as cesium, rubidium or potassium, which is heated to be in a vapor phase. In a further embodiment, the alkali vapor 142 includes buffer gas(es) to slow down collisions with walls of the cavity 102.

Upon formation of the alkali vapor 142, the pump laser 104 injects a light through the second mirror 140 to spin polarize the alkali atoms. This induces an ensemble of alkali atoms to coherently process at a Larmor frequency proportional to the magnitude of an incident magnetic field. In one embodiment, a pump laser light beam 105 is linearly polarized (either vertically or horizontally) when emitted from the pump laser 104. In another embodiment, the pump laser 104 is disabled and no longer generates the pump laser light beam 105 after spin polarizing the alkali atoms.

In one embodiment the pump laser light beam 105 passes through pump laser optics 110 prior to becoming incident upon the cavity 102. In another embodiment, the pump laser optics 110 collimates the pump laser light beam 105. In a further embodiment, the pump laser light beam 105 passes through a first quarter wave plate 111 which transforms the pump laser light beam 105 from vertical or horizontal linear polarization to respectively right hand or left hand circular polarization. Such circular polarization is necessary to induce spin polarization of the alkali atoms in the cavity 102.

Thereafter, the probe laser A 106 and the probe laser B 108 are enabled, and the resonant cavity magnetometer with Pound-Drever-Hall detectors 101 can commence detecting magnetic field strength. In one embodiment, the probe laser A 106 and the probe laser B 108 generate light beams each of which is linearly polarized, but orthogonally polarized with respect to one another (e.g. linear vertical polarization versus linear horizontal polarization). In another embodiment, which pertains to the illustration of FIG. 1, probe laser A 106 generates a laser light beam that is vertically polarized, and probe laser B 108 generates a laser light beam that is horizontally polarized.

In one embodiment, the probe laser A 106 and probe laser B 108 are respectively coupled to probe laser A modulator 130 and probe laser B modulator (132 which are configured to respectively phase or frequency modulate the carrier frequencies of the probe laser A 106 and the probe laser B 108 respectively by PDH modulation signal A ($f_A$) 127 and PDH modulation signal B ($f_B$) 129. In another embodiment, both modulators modulate either the phase or frequency of the respective probe lasers. In a further embodiment, the detector and demodulator A 126 and the detector and demodulator B 124 respectively generate a variable control signal A 123 and a variable control signal B 125, respectively coupled to the probe laser A modulator 130 and the probe laser B modulator 132, to respectively adjust the carrier frequencies of the probe laser A 106 and probe laser B 108. In yet another embodiment, the variable control signal A 123 and the variable control signal B 125 are variable current control signals, e.g. when such lasers are VSCELs.

In one embodiment, the probe laser A modulator 130 and the probe laser B modulator 132 are coupled to the frequency generator 128. In another embodiment, the frequency generator 128 generates sinusoidal waveforms. In a further embodiment, the frequency generator 128 provides the PDH modulation signal A ($f_A$) 127 and the PDH modulation signal B ($f_B$) 129, having different frequencies, respectively to the probe laser A modulator 130 and the probe laser B modulator 132; this has the benefit of reducing crosstalk between the Pound-Drever-Hall detectors. In yet another embodiment, the PDH modulation signal A 127 and the PDH modulation signal B 129 have the same frequency.

In one embodiment, the frequencies of the PDH modulation signal A 127 and the PDH modulation signal B 129 are sufficiently high so that sidebands generated by phase or frequency modulation of the carrier frequency of each laser fall outside the resonance frequency of the cavity 102 (even if the resonance frequency varies with the coherent Larmor precession of the ensemble of alkali atoms). In another embodiment, the PDH modulation signal A 127 and the PDH modulation signal B 129 have frequencies in the microwave, or GHz, range, or a higher frequency range.

The probe laser A 106 and probe laser B 108 respectively generate a modulated vertically polarized probe laser light beam 107 and a modulated horizontally polarized probe laser light beam 109. In one embodiment, the modulated vertically polarized probe laser light beam 107 and a modulated horizontally polarized probe laser light beam 109 have been phase or frequency modulated by the PDH modulation signal A 127 and the PDH modulation signal B 129 respectively.

In one embodiment, the modulated vertically polarized probe laser light beam 107 passes through probe laser A optics 112, and the modulated horizontally polarized probe laser light beam 109 passes through probe laser B optics 108. In a further embodiment, the probe laser A optics 112, and the probe laser B optics 114 respectively collimate the modulated vertically polarized probe laser light beam 107 and the modulated horizontally polarized probe laser light beam 109.

In one embodiment, the modulated vertically polarized probe laser light beam 107 and the modulated horizontally polarized probe laser light beam 109 are combined, e.g. by the first polarized beam splitter 116. The first polarized beam splitter 116 also collimates the modulated vertically polarized probe laser light beam 107 and the modulated horizontally polarized probe laser light beam 109. In another embodiment, a mirror 115 bends the focal direction, by substantially ninety degrees, of the modulated vertically polarized probe laser light beam 107 or the modulated horizontally polarized probe laser light beam 109. The mirror 115 facilitates having the two beams being injected into two ports, separated by a ninety-degree angle, of the first polarized beam splitter 116. FIG. 1 illustrates the modulated vertically polarized probe laser light beam 107 having its focal direction being shifted by ninety degrees by the mirror 115.

In one embodiment, the modulated vertically polarized probe laser light beam 107 and the linearly horizontally polarized probe laser light beam 109 pass through a non-polarizing beam splitter 120. Then, in another embodiment, the modulated vertically polarized probe laser light beam 107 and the modulated horizontally polarized probe laser light beam 109 pass through the second quarter wave plate 122. The second quarter wave plate 122 changes the polarizations of the modulated vertically polarized probe laser light beam 107 and the modulated horizontally polarized probe laser light beam 109 respectively to a modulated right hand circularly polarized probe laser light beam 107' and a modulated left hand circularly polarized probe laser light beam 109'. Thus, the modulated right hand circularly polarized probe laser light beam 107' and the modulated left hand circularly polarized probe laser light beam 109' are incident upon the first mirror 138, and a portion of their energies enters the cavity 142. It is desirable to have the two probe laser light beams circularly and orthogonally polarized to diminish affecting the spin states of the alkali atoms in the alkali vapor 142.

The atoms of the alkali coherently precess at a Larmor frequency:

$$\omega = -\gamma * B \qquad \text{(Equation 1)}$$

where $\gamma$ is a constant, the gyromagnetic ratio of the alkali vapor 142, which varies by element, and B is the magnitude of the magnetic field incident upon the cavity 102.

Figure 2:
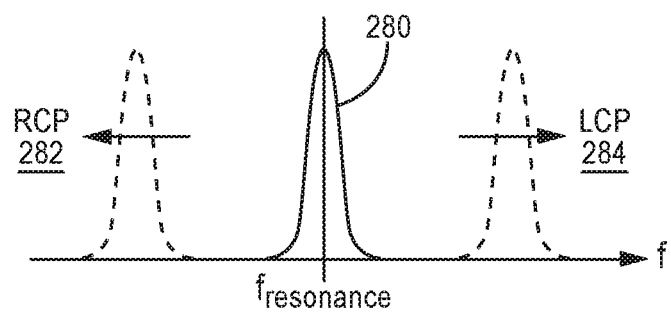
FIG. 2 illustrates the resonant frequencies for right hand circularly polarized light and left hand circularly polarized light moving in opposite directions.

The index of refraction of the alkali vapor 142 varies correspondingly during a cycle of $\omega$. This causes the resonant frequency, $f_{resonance}$ 280, of the cavity 102 to correspondingly shift, or vary, at a rate proportional to $\omega$ during a cycle of $\omega$. However, as illustrated in FIG. 2, the resonant frequency (RCP) 282 for the modulated right hand circularly polarized probe laser light beam 107' and the resonant frequency (LCP) 284 for the modulated left hand circularly polarized probe laser light beam 109' move one hundred eighty degrees out of phase, i.e. in opposite directions. Note, FIG. 2 is not drawn to scale with respect to its frequency axis, and is provided for illustrative purposes only.

Thus, the carrier frequencies of the modulated right hand circularly polarized probe laser light beam 107' and the modulated left hand circularly polarized probe laser light beam 109' are detuned from their corresponding resonant frequencies of the cavity 102. When the carrier frequencies of the modulated laser beams are close to the resonant frequencies of the cavity, the carrier frequency of each light beam will be phase shifted with a sign that is based upon which side of the resonance the carrier frequency falls.

The modulated right hand circularly polarized probe laser light beam 107' and the modulated left hand circularly polarized probe laser light beam 109' are resonantly coupled to the cavity 102, and then reflected from the cavity 102 through the second quarter wave plate 122. The second quarter wave plate 122 transforms the reflected modulated right hand circularly polarized probe laser light beam 107' and the reflected modulated left hand circularly polarized probe laser light beam 109' respectively to reflected modulated vertically polarized probe laser light beam 107 and reflected modulated horizontally polarized probe laser light beam 109. The reflected modulated vertical polarized probe laser light beam 107 and the reflected modulated horizontal polarized probe laser light beam 109 respectively fall incident upon the detector and demodulator A 124 and the detector and demodulator B 126.

Two Pound-Hall-Drever detectors are formed by coupling the PDH modulation signal A 127 and the PDH modulation signal B 129 respectively to the detector and demodulator A 124 and the detector and demodulator B 126. Each Pound-Hall-Drever detector has a sensitivity approximately proportional to the Finesse of the cavity 102:

$$D \approx 16\sqrt{PcPs} * \frac{F}{\lambda} \qquad \text{(Equation 2)}$$

where D is the slope of error signal, Pc is the power of the carrier signal, Ps is the power of a first order sideband signal, F is the Finesse of the cavity 102, and $\lambda$ is the wavelength of the resonance frequency of the cavity 102. In one embodiment, the power of the carrier signal and the first order sideband signal remains relatively constant.

Figure 3:
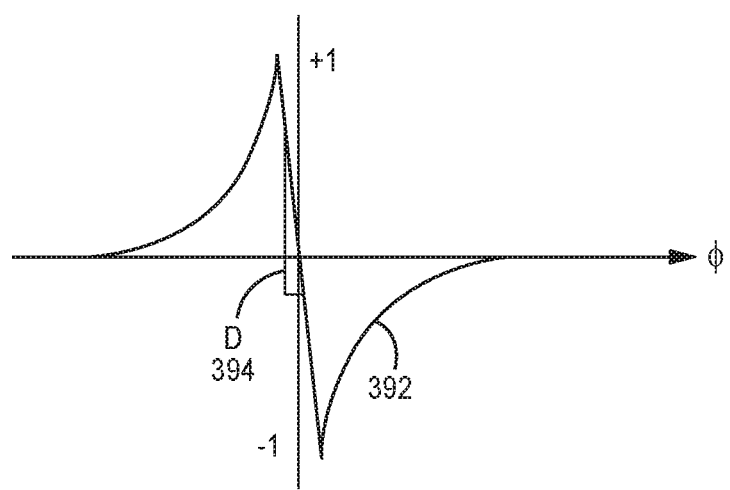
FIG. 3 illustrate one embodiment of the error signal generated by a Pound-Hall-Drever detector.

When the carriers of the reflected modulated light beams are mixed with their corresponding PDH modulation signals, respectively in the detector and demodulator A 124 and the detector and demodulator B 126, corresponding error signals are generated. FIG. 3 illustrates one embodiment of the error signal 392 generated by a Pound-Hall-Drever detector showing the relatively steep slope, D 394, about the resonance of the cavity 102, arising from a relatively high Finesse. The x-axis represents the phase (1) of the carrier frequency of the corresponding reflected modulated laser light beam. Therefore, regardless of diminished size of the cavity 102, and thus decreased single pass optical path length arising from the diminished cavity size, the sensitivity of detecting atomic coherent Larmor precession in the cavity 102 is enhanced by increasing the Finesse of the cavity 102. Further, the sensitivity can also be increased by increasing the power levels of the probe lasers, i.e. to increase carrier and first order sideband power levels.

The variable control signal A 123 and the variable control signal B 125, i.e. the error signals, of each of the detector and demodulator A 124 and the detector and demodulator B 126 are respectively coupled to the probe laser A modulator 130 and the probe laser B modulator 132. The probe laser A modulator 130 and the probe laser B modulator 132 utilize their corresponding error signals to respectively adjust the carrier frequencies of the modulated vertically polarized probe laser light beam 107 and the modulated horizontally polarized probe laser light beam 109 so that the carrier frequencies of those light beams track the respectively varying resonant frequencies of the cavity 102.

The control signal A 123 and the control signal B 125 are also coupled to respective inputs of a differential amplifier (DA) 134 which generates a sinusoidal signal having a frequency that is the Larmor frequency (or frequency of the coherent Larmor precession of the ensemble of Alkali atoms in the cavity 102) which is proportional to the magnitude of the incident magnetic field. Taking the difference of the control signal A 123 and the control signal B 125 with the differential amplifier 134 removes any common mode errors in such control signals. In one embodiment, the output of the differential amplifier 134 is coupled to an analog to digital converter 136, which generates a digitized sine wave having a frequency that is the Larmor frequency. The digitized sine wave is presented at the output 137 of the resonant cavity magnetometer with Pound-Drever-Hall detectors 101.

Figure 4:
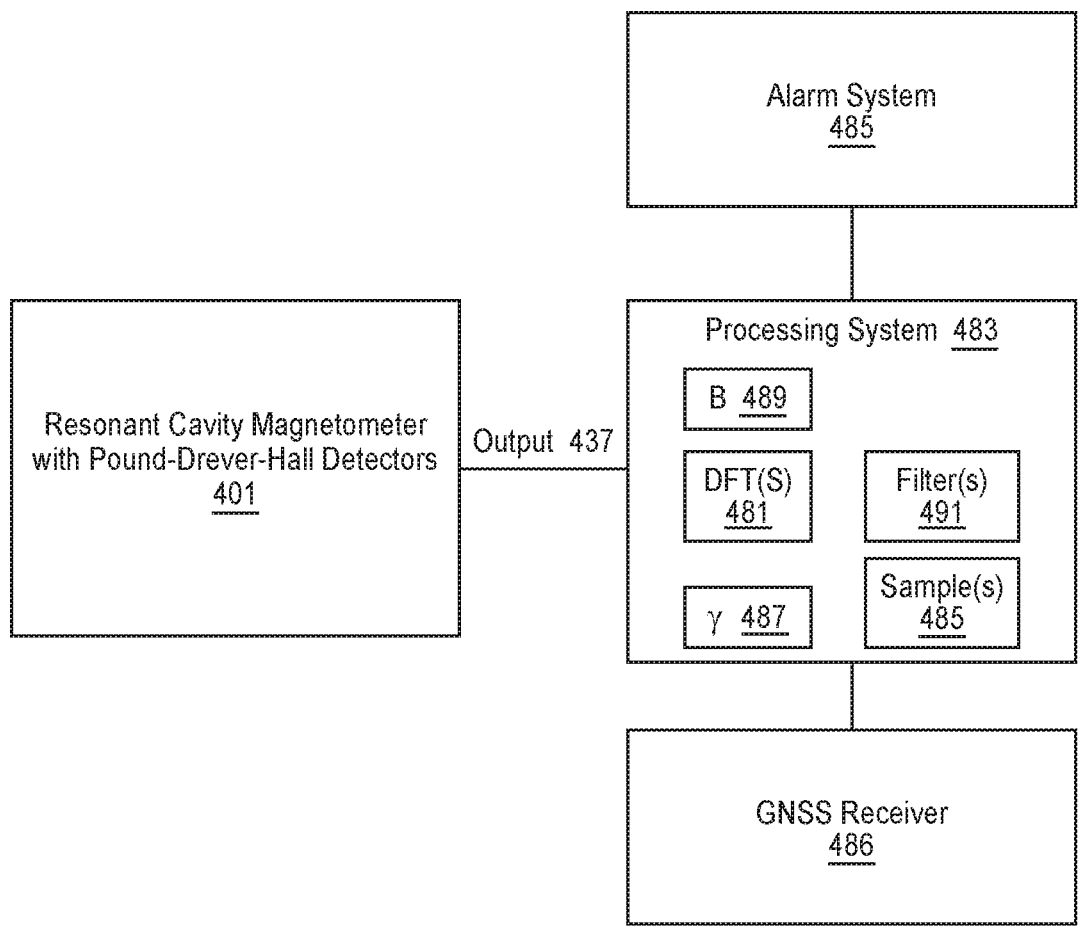
FIG. 4 illustrates a block diagram of an exemplary system including the cavity magnetometer with Pound-Drever-Hall detectors (PDH cavity magnetometer)

FIG. 4 illustrates one embodiment of a block diagram of a system including the resonant cavity magnetometer with Pound-Drever-Hall detectors (cavity magnetometer system) 410. The resonant cavity magnetometer system 410 includes a resonant cavity magnetometer with Pound-Drever-Hall detectors 401, a processing system 483, a global navigation satellite system (GNSS) receiver 486, and an alarm system (alarm) 485. The output 437 of the resonant cavity magnetometer with Pound-Drever-Hall detectors 401 is coupled to the processing system 483. In another embodiment, the processing system 483 includes a processor coupled to a memory. Alternatively, the processing system 483 can be implemented, at least in part, with a state machine or a field programmable gate array.

In one embodiment, the processing system 483 receives a digitized sine wave whose frequency is proportional to the magnitude of the magnetic field incident on the cavity 102 of the resonant cavity magnetometer with Pound-Drever-Hall detectors 401. In a further embodiment, the processing system 483 includes one or more discrete Fourier transform algorithms 481, e.g. a fast Fourier transform, that are used to analyze the digitized sine wave to ascertain the frequency of the digitized sine wave. In yet another embodiment, the processing system 483 includes one or more digital filters 491, e.g. infinite impulse response filters and finite impulse filters, to suppress noise and enhance the sensitivity of processing system 483 so that it can determine the frequency when the digitized sine wave amplitude is relatively low. For example, such one or more digital filters 491 can implement low pass and/or bandpass filter(s). In yet a further embodiment, the processing system 483 periodically stores samples 485 of the frequencies of the Fourier transformed, digitized sine wave.

In one embodiment, the processing system 483 includes, or stores, the gyromagnetic ratio ($\gamma$) 487 of the alkali atoms in the cavity 102. Thus, the processing system 483 calculates the magnitude of the incident magnetic field for each stored sample of the Fourier transformed, digitized sine wave, e.g. using the equation above. In another embodiment, the processing system 483 periodically stores the magnitude of the incident magnetic field (B) 489.

In one embodiment, the global navigation satellite system receiver 486 generates the location of the resonant cavity magnetometer system 410 and/or time, e.g. corresponding to Larmor frequency measurements by the resonant cavity magnetometer system 410. In another embodiment, the global navigation satellite system receiver 486 generates the location and/or time corresponding to the measurement location and/or time of each stored sample of the Fourier transformed, digitized sine wave and/or magnitude of the incident magnetic field. In a further embodiment, such location and/or times are respectively stored with the samples 485 and/or the magnitude of the incident magnetic field 489. In yet another embodiment, the global navigation satellite system receiver 486 is a global positioning satellite receiver. In yet a further embodiment, if the processing system 483 determines that Larmor frequency or the corresponding calculated magnetic field magnitude is greater than a threshold stored in the processing system, then the processing system 483 causes the alarm system 485 to generate an alarm to alert another system or operators of the resonant cavity magnetometer system or the other system.

Figure 5:
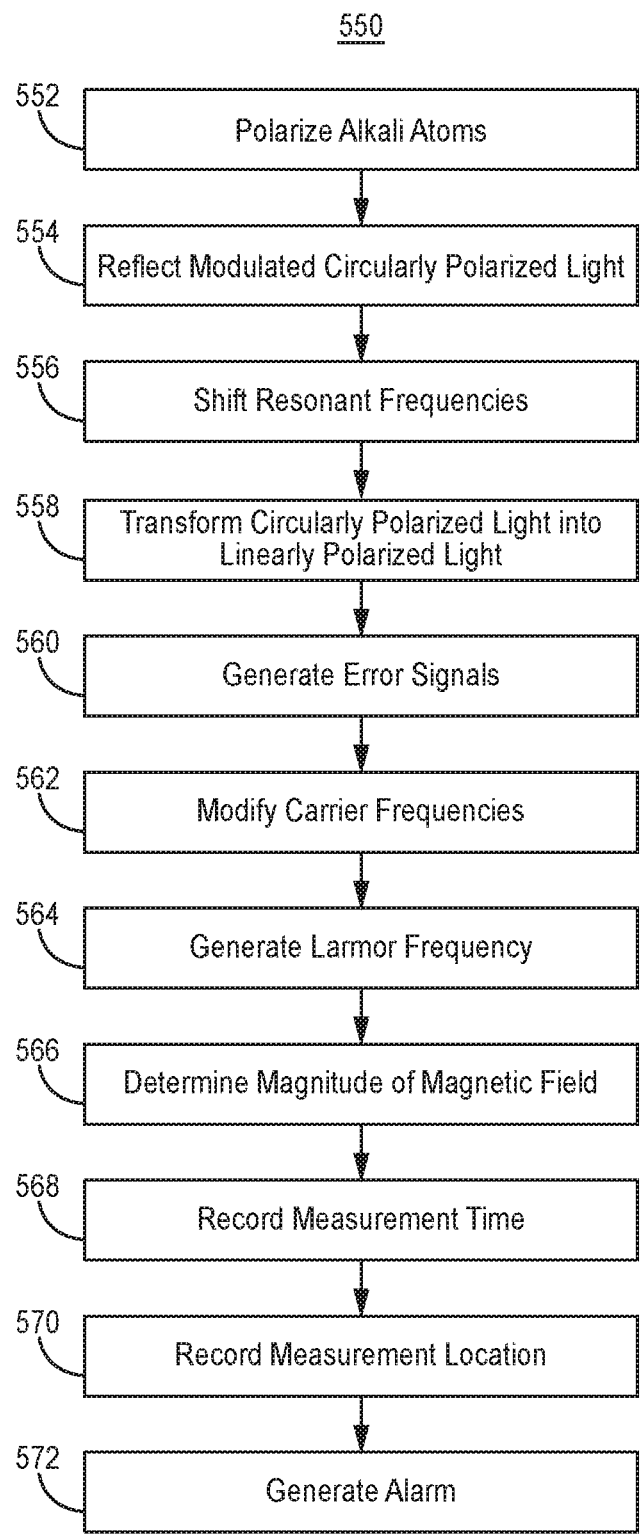
FIG. 5 illustrates one embodiment of a method of operation for a cavity magnetometer system.

FIG. 5 illustrates one embodiment of a method 550 of operation for a resonant cavity magnetometer system 410. To the extent that the embodiment of method 550 shown in FIG. 5 is described herein as being implemented in the systems shown in FIGS. 1 through 4, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 552, alkali atoms, e.g. in a vapor state, in a cavity 102 are spin polarized. In one embodiment, the alkali atoms are spin polarized by injecting, for a finite period of time, circularly polarized light into the alkali vapor 142. In another embodiment, the injection of the circularly polarized light is halted after the alkali atoms are spin polarized. In another embodiment, the circularly polarize light is created by transforming, e.g. with a quarter wave plate, linearly polarized light.

After the alkali atoms are polarized, in block 554, inject, into the polarized alkali atoms, modulated right hand circularly polarized light and modulated left hand circularly polarized light. In one embodiment, the carrier of the modulated right hand circularly polarized light and left hand circularly polarized light initially have carrier frequencies equal to the resonance frequency of the cavity 102 when the polarized alkali atoms are orthogonal to the modulated right hand circularly polarized light and the modulated left hand circularly polarized light. In another embodiment, the right hand circularly polarized light and left hand circularly polarized light are frequency or phase modulated by frequencies that are sufficiently high so that generated sidebands fall outside of the resonance(s) of the cavity 102. In a further embodiment, the right hand circularly polarized light and left hand circularly polarized light are frequency or phase modulated by same frequency or different frequencies.

In one embodiment, the modulated right hand circularly polarized light and modulated left hand circularly polarized light are created by first modulating vertically linearly polarized light and horizontally linearly polarized light. Then, the modulated vertically linearly polarized light and the modulated horizontally linearly polarized light are respectively transformed, e.g. by a quarter wave plate, to modulated right hand circularly polarized light and modulated left hand circularly polarized light. In another embodiment, the carrier of the modulated vertically linearly polarized light and modulated horizontally linearly polarized light initially have carrier frequencies equal to the resonance frequency of the cavity 102 when the polarized alkali atoms are orthogonal to the modulated vertically linearly polarized light and the modulated horizontally linearly polarized light. In a further embodiment, the modulated vertically linearly polarized light and modulated horizontally linearly polarized light are frequency or phase modulated by frequencies that are sufficiently high so that generated sidebands fall outside of the resonance(s) of the cavity 102. In yet another embodiment, the modulated vertically linearly polarized light and modulated horizontally linearly polarized light are frequency or phase modulated by same frequency or by different frequencies.

In block 556, the resonant frequencies of the cavity 102 corresponding to the modulated right hand circularly polarized light and the modulated left hand circularly polarized light are modulated (as described above) by a frequency that is the Larmor frequency (the frequency of the coherent Larmor precession of the ensemble of alkali atoms) and which is proportional to the magnitude of the incident magnetic field. In one embodiment, reflect a greater amount of the modulated right hand circularly polarized light and the modulated left hand circularly polarized light from the cavity 102 due to the shifted resonance frequencies.

In one embodiment, in block 558, transform the reflected modulated right hand circularly polarized light and the reflected modulated left hand circularly polarized light respectively to reflected modulated vertically polarized light and reflected modulated horizontally polarized light. Then, in block 560, generate error signals having a slope proportional to the Finesse of the cavity 102 for each of reflected modulated polarized light signals, and having signs indicative as to whether the corresponding carrier frequency of such light signals is above or below the corresponding resonant frequencies of the cavity 102. In one embodiment, generating the error signals comprises separately detecting each of the reflected modulated vertically polarized light signal and reflected modulated horizontally polarized light signal; and, then, demodulating each of the detected reflected modulated vertically polarized light and the detected reflected modulated horizontally polarized light signal using the corresponding PDH modulation signals.

Then, in block 562, using the corresponding error signals, respectively modify, or adjust, the carrier frequencies of the modulated right hand circularly polarized light and the modulated left hand circularly polarized light so that they track changes in resonant frequencies corresponding to each modulated polarized light signal, e.g. resulting from the coherent Larmor precession of the ensemble of the alkali atoms.

In block 564, generate a measured Larmor precession frequency. In one, embodiment, the Larmor precession frequency is generated by subtracting the error signals for each of the detected modulated polarized light signals. In one embodiment digitize the Larmor precession frequency.

In block 566, determine the magnitude of the magnetic field strength by dividing the Larmor frequency by the gyromagnetic ratio for the alkali. In one embodiment, in block 568, record, e.g. using a processing system 483 and a global navigation satellite system receiver 486, the time of the measurement of the Larmor precession frequency. In another embodiment, in block 570, record the location of the measurement of the Larmor precession frequency. In a further embodiment, in block 572, generate an alarm, e.g. with the processing system 483 and the alarm system 485, if either the Larmor frequency or a determined magnitude of the magnetic field strength exceed a threshold level.

Example Embodiments

Example 1 includes a magnetometer, comprising: a cavity having a first mirror and a second mirror at opposite ends of the cavity; wherein the cavity contains alkali atoms; wherein the cavity is configure to receive circularly polarized pump light to spin polarize the alkali atoms; wherein resonant frequencies of the cavity, containing the spin polarized alkali atoms, change at a rate proportionally with the magnitude of a magnetic field incident upon the cavity; a first detector and demodulator; a second detector and demodulator; a frequency generator configured to generate a first PDH modulation signal and a second PDH modulation signal; a first probe light modulator, coupled to the first detector and demodulator and the frequency generator; a second probe light modulator coupled to the second detector and demodulator and the frequency generator; a first probe light source, coupled to the first probe light modulator, configured to generate a modulated vertically polarized first probe light; wherein the first probe light modulator is configured to frequency or phase modulate the vertically polarized first probe light with the first PDH modulation signal; a second probe light source, coupled to the second probe light modulator, configured to generate a modulate horizontally polarized second probe light; wherein the second probe light modulator is configured to frequency or phase the horizontally polarized second probe light with the second PDH modulation signal; a quarter wave plate configured to transform the modulated vertically polarized first probe light to modulated right hand circularly polarized first probe light, and to transform the modulated horizontally polarized second probe light to modulated left hand circularly polarized second probe light; wherein the modulated right hand circularly polarized first probe light and the modulated left hand circularly polarized second probe light are incident upon and reflected from the cavity; wherein the quarter wave plate is configured to transform the reflected modulated right hand circularly polarized first probe light to reflected modulated vertically polarized modulated first probe light, and to transform the reflected modulated left hand circularly polarized second probe light pass to reflected modulated horizontally polarized modulated second probe light; wherein the first detector and demodulator is configured to generate a first error signal; wherein the second polarized detector and demodulator is configured to generate a second error signal; wherein the first probe laser modulator is configured to adjust a carrier frequency of the modulated first probe light in response to the first error signal; wherein the second probe laser modulator is configured to adjust a carrier frequency of the modulated second probe light in response to the second error signal; and a differential amplifier, coupled to the first error signal and the second error signal, configured to generate a signal proportional to the amplitude of the magnetic field incident upon the cavity.

Example 2 includes the magnetometer of Example 1, further comprising a pump light source configured to generate linearly polarized pump light; and a second quarter wave plate configured to transform the linearly polarized pump light to the circularly polarized pump light.

Example 3 includes the magnetometer of any of Examples 1-2, further comprising: a first polarized beam splitter configured to combine the modulated vertically polarized first probe light and the modulated horizontally polarized second probe light; and a second polarized beam splitter configured to direct the reflected modulated vertically polarized first probe light to the first detector and demodulator, and to direct the reflected modulated horizontally polarized second probe light to the second detector and demodulator.

Example 4 includes the magnetometer of any of Examples 1-3, further comprising an analog to digital converter configured to digitize an output of the analog to digital converter.

Example 5 includes the magnetometer of any of Examples 1-4, wherein a frequency of the first PDH modulation signal is different than a frequency of the second PDH modulation signal.

Example 6 includes the magnetometer of any of Examples 1-5, wherein at least one of the first probe light source and the second probe light source is a laser.

Example 7 includes the magnetometer of any of Examples 5-6, wherein the at least one of the first probe light source, and the second probe light source is a vertical-cavity surface-emitting laser.

Example 8 includes a magnetometer system, comprising: a magnetometer, comprising: a cavity having a first mirror and a second mirror at opposite ends of the cavity; wherein the cavity contains alkali atoms; wherein the cavity is configure to receive circularly polarized pump light to spin polarize the alkali atoms; wherein resonant frequencies of the cavity, containing the spin polarized alkali atoms, change at a rate proportionally with the magnitude of a magnetic field incident upon the cavity; a first detector and demodulator; a second detector and demodulator; a frequency generator configured to generate a first PDH modulation signal and a second PDH modulation signal; a first probe light modulator, coupled to the first detector and demodulator and the frequency generator; a second probe light modulator coupled to the second detector and demodulator and the frequency generator; a first probe light source, coupled to the first probe light modulator, configured to generate a modulated vertically polarized first probe light; wherein the first probe light modulator is configured to frequency or phase modulate the vertically polarized first probe light with the first PDH modulation signal; a second probe light source, coupled to the second probe light modulator, configured to generate a modulated horizontally polarized second probe light; wherein the second probe light modulator is configured to frequency or phase the horizontally polarized second probe light with the second PDH modulation signal; a quarter wave plate configured to transform the modulated vertically polarized first probe light to modulated right hand circularly polarized first probe light, and to transform the modulated horizontally polarized second probe light to modulated left hand circularly polarized second probe light; wherein the modulated right hand circularly polarized first probe light and the modulated left hand circularly polarized second probe light are incident upon and reflected from the cavity; wherein the quarter wave plate is configured to transform the reflected modulated right hand circularly polarized first probe light to reflected modulated vertically polarized modulated first probe light, and to transform the reflected modulated left hand circularly polarized second probe light pass to reflected modulated horizontally polarized modulated second probe light; wherein the first detector and demodulator is configured to generate a first error signal; wherein the second detector and demodulator is configured to generate a second error signal; wherein the first probe laser modulator is configured to adjust a carrier frequency of the modulated first probe light in response to the first error signal; wherein the second probe laser modulator is configured to adjust a carrier frequency of the modulated second probe light in response to the second error signal; and a differential amplifier, coupled to the first error signal and the second error signal, configured to generate a signal proportional to the amplitude of the magnetic field incident upon the cavity; and wherein the differential amplifier has an output; and a processing system coupled to the output of the differential amplifier.

Example 9 includes the magnetometer system of Example 8, further comprising a global navigation satellite system receiver.

Example 10 includes the magnetometer system of any of Examples 8-9 further comprising an alarm system.

Example 11 includes the magnetometer of any of Examples 8-10, further comprising a pump light source configured to generate linearly polarized pump light; and a second quarter wave plate configured to transform the linearly polarized pump light to the circularly polarized pump light.

Example 12 includes the magnetometer of any of Examples 8-11, further comprising: a first polarized beam splitter configured to combine the modulated vertically polarized first probe light and the modulated horizontally polarized second probe light; and a second polarized beam splitter configured to direct the reflected modulated vertically polarized first probe light to the horizontally polarized detector and demodulator, and to direct the reflected modulated horizontally polarized second probe light do the vertically polarized detector and demodulator.

Example 13 includes the magnetometer of any of Examples 8-12, further comprising an analog to digital converter configured to digitize an output of the analog to digital converter.

Example 14 includes the magnetometer of any of Examples 8-13, wherein a frequency of the first PDH modulation signal is different than a frequency of the second PDH modulation signal.

Example 15 includes the magnetometer of any of Examples 1-14, wherein at least one of the first probe light source and the second probe light source is a laser.

Example 16 includes a method, comprising: spin polarizing alkali atoms in a cavity; shifting resonant frequencies of the cavity at a rate proportional to a magnitude of a magnetic field incident upon the cavity; reflecting modulated right hand circularly polarized light and modulated left hand circularly polarized light from the cavity; transforming the reflected modulated right hand circularly polarized light to reflected modulated vertically polarized light, and the reflected modulated left hand circularly polarized light to reflected modulated horizontally polarized modulated light; generating a first error signal having an amplitude proportional to the shift in a resonant frequency corresponding to the reflected modulated vertically polarized light and a sign indicative of whether a frequency of the reflected modulated vertically polarized light is above or below the corresponding resonant frequency; generating a second error signal having an amplitude proportional to the shift in a resonant frequency corresponding to the reflected modulated horizontally polarized light and a sign indicative of whether a frequency of the reflected modulated horizontally polarized light is above or below the corresponding resonant frequency; adjusting a carrier frequency of the modulated right hand circularly polarized light in response to the first error signal; adjusting a carrier frequency of the modulated left hand circularly polarized light in response to the second error signal; and generating a measured Larmor frequency.

Example 17 includes the method of Example 16, further comprising determining the magnitude of the magnetic field.

Example 18 includes the method of any of Examples 16-17, further comprising recording a time corresponding to the measured Larmor frequency.

Example 19 includes the method of any of Examples 16-18, further comprising recording a location corresponding to the measured Larmor frequency.

Example 20 includes the method of any of Examples 16-19, further comprising generating an alarm if the measured Larmor frequency or the determined magnitude of the magnetic field exceeds a threshold level.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A magnetometer, comprising:
   a cavity having a first mirror and a second mirror at opposite ends of the cavity;
   wherein the cavity contains alkali atoms;
   wherein the cavity is configured to receive circularly polarized pump light to spin polarize the alkali atoms;
   wherein resonant frequencies of the cavity, containing the spin polarized alkali atoms, change at a rate proportionally with the magnitude of a magnetic field incident upon the cavity;
   a first detector and demodulator;
   a second detector and demodulator;
   a frequency generator configured to generate a first Pound-Drever-Hall (PDH) modulation signal and a second PDH modulation signal;
   a first probe light modulator, coupled to the first detector and demodulator and the frequency generator;
   a second probe light modulator coupled to the second detector and demodulator and the frequency generator;
   a first probe light source, coupled to the first probe light modulator, configured to generate a modulated vertically polarized first probe light;
   wherein the first probe light modulator is configured to frequency or phase modulate the vertically polarized first probe light with the first PDH modulation signal;
   a second probe light source, coupled to the second probe light modulator, configured to generate a modulated horizontally polarized second probe light;
   wherein the second probe light modulator is configured to frequency or phase modulate the horizontally polarized second probe light with the second PDH modulation signal;
   a quarter wave plate configured to transform the modulated vertically polarized first probe light to modulated right hand circularly polarized first probe light, and to transform the modulated horizontally polarized second probe light to modulated left hand circularly polarized second probe light;
   wherein the modulated right hand circularly polarized first probe light and the modulated left hand circularly polarized second probe light are incident upon and reflected from the cavity;
   wherein the quarter wave plate is configured to transform the reflected modulated right hand circularly polarized first probe light to reflected modulated vertically polarized modulated first probe light, and to transform the reflected modulated left hand circularly polarized second probe light pass to reflected modulated horizontally polarized modulated second probe light;
   wherein the first detector and demodulator is configured to generate a first error signal;
   wherein the second detector and demodulator is configured to generate a second error signal;
   wherein the first probe light modulator is configured to adjust a first carrier frequency of the modulated first probe light in response to the first error signal;
   wherein the second probe light modulator is configured to adjust a second carrier frequency of the modulated second probe light in response to the second error signal; and
   a differential amplifier, coupled to the first error signal and the second error signal, configured to generate a signal proportional to the amplitude of the magnetic field incident upon the cavity.

2. The magnetometer of claim 1, further comprising a pump light source configured to generate linearly polarized pump light; and
   a second quarter wave plate configured to transform the linearly polarized pump light to the circularly polarized pump light.

3. The magnetometer of claim 1, further comprising:
   a first polarized beam splitter configured to combine the modulated vertically polarized first probe light and the modulated horizontally polarized second probe light; and
   a second polarized beam splitter configured to direct the reflected modulated vertically polarized first probe light to the first detector and demodulator, and to direct the reflected modulated horizontally polarized second probe light to the second detector and demodulator.

4. The magnetometer of claim 1, further comprising an analog to digital converter configured to digitize an output of the analog to digital converter.

5. The magnetometer of claim 1, wherein a frequency of the first PDH modulation signal is different than a frequency of the second PDH modulation signal.

6. The magnetometer of claim 1, wherein at least one of the first probe light source and the second probe light source is a laser.

7. The magnetometer of claim 5, wherein the at least one of the first probe light source, and the second probe light source is a vertical-cavity surface-emitting laser.

8. A magnetometer system, comprising:
a magnetometer, comprising:
- a cavity having a first mirror and a second mirror at opposite ends of the cavity;
- wherein the cavity contains alkali atoms;
- wherein the cavity is configured to receive circularly polarized pump light to spin polarize the alkali atoms;
- wherein resonant frequencies of the cavity, containing the spin polarized alkali atoms, change at a rate proportionally with the magnitude of a magnetic field incident upon the cavity;
- a first detector and demodulator;
- a second detector and demodulator;
- a frequency generator configured to generate a first Pound-Drever-Hall (PDH) modulation signal and a second PDH modulation signal;
- a first probe light modulator, coupled to the first detector and demodulator and the frequency generator;
- a second probe light modulator coupled to the second detector and demodulator and the frequency generator;
- a first probe light source, coupled to the first probe light modulator, configured to generate a modulated vertically polarized first probe light;
- wherein the first probe light modulator is configured to frequency or phase modulate the vertically polarized first probe light with the first PDH modulation signal;
- a second probe light source, coupled to the second probe light modulator, configured to generate a modulated horizontally polarized second probe light;
- wherein the second probe light modulator is configured to frequency or phase modulate the horizontally polarized second probe light with the second PDH modulation signal;
- a quarter wave plate configured to transform the modulated vertically polarized first probe light to modulated right hand circularly polarized first probe light, and to transform the modulated horizontally polarized second probe light to modulated left hand circularly polarized second probe light;
- wherein the modulated right hand circularly polarized first probe light and the modulated left hand circularly polarized second probe light are incident upon and reflected from the cavity;
- wherein the quarter wave plate is configured to transform the reflected modulated right hand circularly polarized first probe light to reflected modulated vertically polarized modulated first probe light, and to transform the reflected modulated left hand circularly polarized second probe light pass to reflected modulated horizontally polarized modulated second probe light;
- wherein the first detector and demodulator is configured to generate a first error signal;
- wherein the second detector and demodulator is configured to generate a second error signal;
- wherein the first probe light modulator is configured to adjust a first carrier frequency of the modulated first probe light in response to the first error signal;
- wherein the second probe light modulator is configured to adjust a second carrier frequency of the modulated second probe light in response to the second error signal; and
- a differential amplifier, coupled to the first error signal and the second error signal, configured to generate a signal proportional to the amplitude of the magnetic field incident upon the cavity; and
- wherein the differential amplifier has an output; and
a processing system coupled to the output of the differential amplifier.

9. The magnetometer system of claim 8, further comprising a global navigation satellite system receiver.

10. The magnetometer system of claim 8 further comprising an alarm system.

11. The magnetometer of claim 8, further comprising a pump light source configured to generate linearly polarized pump light; and
- a second quarter wave plate configured to transform the linearly polarized pump light to the circularly polarized pump light.

12. The magnetometer of claim 8, further comprising:
- a first polarized beam splitter configured to combine the modulated vertically polarized first probe light and the modulated horizontally polarized second probe light; and
- a second polarized beam splitter configured to direct the reflected modulated vertically polarized first probe light to the horizontally polarized detector and demodulator, and to direct the reflected modulated horizontally polarized second probe light do the vertically polarized detector and demodulator.

13. The magnetometer of claim 8, further comprising an analog to digital converter configured to digitize an output of the analog to digital converter.

14. The magnetometer of claim 8, wherein a frequency of the first PDH modulation signal is different than a frequency of the second PDH modulation signal.

15. The magnetometer of claim 1, wherein at least one of the first probe light source and the second probe light source is a laser.

16. A method, comprising:
spin polarizing alkali atoms in a cavity;
shifting resonant frequencies of the cavity at a rate proportional to a magnitude of a magnetic field incident upon the cavity;
reflecting modulated right hand circularly polarized light and modulated left hand circularly polarized light from the cavity;
transforming the reflected modulated right hand circularly polarized light to reflected modulated vertically polarized light, and the reflected modulated left hand circularly polarized light to reflected modulated horizontally polarized modulated light;
generating a first error signal having an amplitude proportional to the shift in a resonant frequency corresponding to the reflected modulated vertically polarized light and a sign indicative of whether a frequency of the reflected modulated vertically polarized light is above or below the corresponding resonant frequency;
generating a second error signal having an amplitude proportional to the shift in a resonant frequency corresponding to the reflected modulated horizontally polarized light and a sign indicative of whether a frequency of the reflected modulated horizontally polarized light is above or below the corresponding resonant frequency;
adjusting a first carrier frequency of the modulated right hand circularly polarized light in response to the first error signal;
adjusting a second carrier frequency of the modulated left hand circularly polarized light in response to the second error signal; and generating a measured Larmor frequency.

17. The method of claim 16, further comprising determining the magnitude of the magnetic field.

18. The method of claim 16, further comprising recording a time corresponding to the measured Larmor frequency.

19. The method of claim 16, further comprising recording a location corresponding to the measured Larmor frequency.

20. The method of claim 16, further comprising generating an alarm if the measured Larmor frequency or the determined magnitude of the magnetic field exceeds a threshold level.

* * * * *